United States Patent [19]

Foster et al.

[11] Patent Number: 4,856,004

[45] Date of Patent: Aug. 8, 1989

[54] MICROPROCESSOR BASED BCH DECODER

[75] Inventors: Robert I. Foster, Mesa; Beth A. Longbrake, Cave Creek, both of Ariz.

[73] Assignee: Motorola, Inc., Schaumburg, Ill.

[21] Appl. No.: 104,186

[22] Filed: Oct. 5, 1987

[51] Int. Cl.⁴ ............................................. G06F 11/00
[52] U.S. Cl. ........................................................ 371/37
[58] Field of Search .......................... 371/37, 38, 39, 40

[56] References Cited

U.S. PATENT DOCUMENTS

| | | | |
|---|---|---|---|
| 4,360,916 | 12/1979 | Kustedjo et al. | 371/37 |
| 4,433,415 | 2/1984 | Kojima | 371/37 |
| 4,471,485 | 9/1984 | Prevot et al. | 371/37 |
| 4,646,312 | 2/1987 | Goldsbury et al. | 371/37 |
| 4,648,091 | 3/1987 | Gajjar | 371/37 |
| 4,665,523 | 5/1987 | Citron et al. | 371/37 |
| 4,694,455 | 9/1987 | Koga | 371/37 |
| 4,747,103 | 5/1988 | Iwamura et al. | 371/37 |

FOREIGN PATENT DOCUMENTS 165147 12/1985 European Pat. Off. ............. 371/37

OTHER PUBLICATIONS

*The Theory of Error Correcting Codes*, MacWilliams et al., pp. 270-271, Dec. 1977.

Primary Examiner—A. D. Pellinen
Assistant Examiner—Geoffrey S. Evans
Attorney, Agent, or Firm—Frank J. Bogacz

[57] ABSTRACT

A microprocessor based system which implements BCH decoder algorithms in a sufficiently efficient manner to allow real time BCH decoding of a BCH(255,131) code is disclosed. Table lookup operations utilizing successive M-bit serial portions of BCH encoded input data as table offsets permit the microprocessor to generate syndrome using M-bit parallel portions of the input data. Additional table lookup operations which utilize tables stored in ROM memory speed execution time of multiply operations and detection of roots for inverse error location polynomials.

14 Claims, 4 Drawing Sheets

MICROPROCESSOR BASED BCH DECODER

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

This invention generally relates to BCH decoders and methods for decoding BCH encoded blocks of data. More specifically, the present invention relates to such decoders which utilize microprocessor based circuits to implement decoding algorithms.

Transmitted data are often encoded using error correcting codes to maximize a probability of a data receiver obtaining precisely the data that a data transmitter intends to transmit. One desirable class of codes which may be used for such error correction are known as Bose-Chaudhuri-Hocquenghem (BCH) codes. A transmitter must encode the data in a predetermined manner which will be known to those skilled in the art once a particular BCH code has been selected. The encoded data is then transmitted and received by a receiver. The receiver must then decode the BCH encoded data and correct any indicated errors before it obtains the data that the transmitter intended to transmit.

Decoding BCH encoded data is a relatively complicated task compared to encoding BCH data. Prior art BCH decoders tent to utilize a large quantity of special purpose linear feedback logic circuits to perform the steps required by BCH decoding algorithms. Such special purpose circuits permit the decoder to rapidly decode BCH encoded data, but result in a relatively expensive, less reliable, and inflexible decoder. On the other hand, microprocessor based circuits are capable of simply and inexpensively performing the algorithms required by a BCH decoder. However, a straight forward simulation of the linear feedbacks circuits conventionally used in BCH decoders results in a BCH decoder which performs the decoding task too slowly to be of value in many applications.

SUMMARY OF THE INVENTION

Accordingly, it is an object of the present invention to provide an improved BCH decoding apparatus and method which is based on microprocessor circuits, is relatively inexpensive, and performs the BCH decoding task fast enough to be of value in a real time application.

Another object of the present invention concerns providing an improved BCH decoder which performs operations on serially occurring BCH data so that parallel processing utilizing several of the serial data bits is permitted.

Yet another object of the present invention concerns providing an improved BCH decoder which organizes a memory portion of a microprocessor based system to increase execution speed of BCH algorithms.

The above and other objects and advantages of the present invention are carried out in one form by a decoder which utilizes a microprocessor, a device which couples a stream of BCH encoded data to the microprocessor, and another device coupled to the microprocessor which converts M successive bits of the input data stream into N-bit finite field elements so that a syndrome which represents the stream of BCH encoded data may be calculated by the microprocessor using the N-bit values rather than single bits of input data.

BRIEF DESCRIPTION OF THE DRAWINGS

A more complete understanding of the present invention may be derived by referring to the detailed description and claims when considered in connection with the accompanying drawings, wherein like reference numbers throughout the drawings indicate similar features, and wherein:

DETAILED DESCRIPTION OF THE PREFERRED EMBODIMENT

Figure 1:
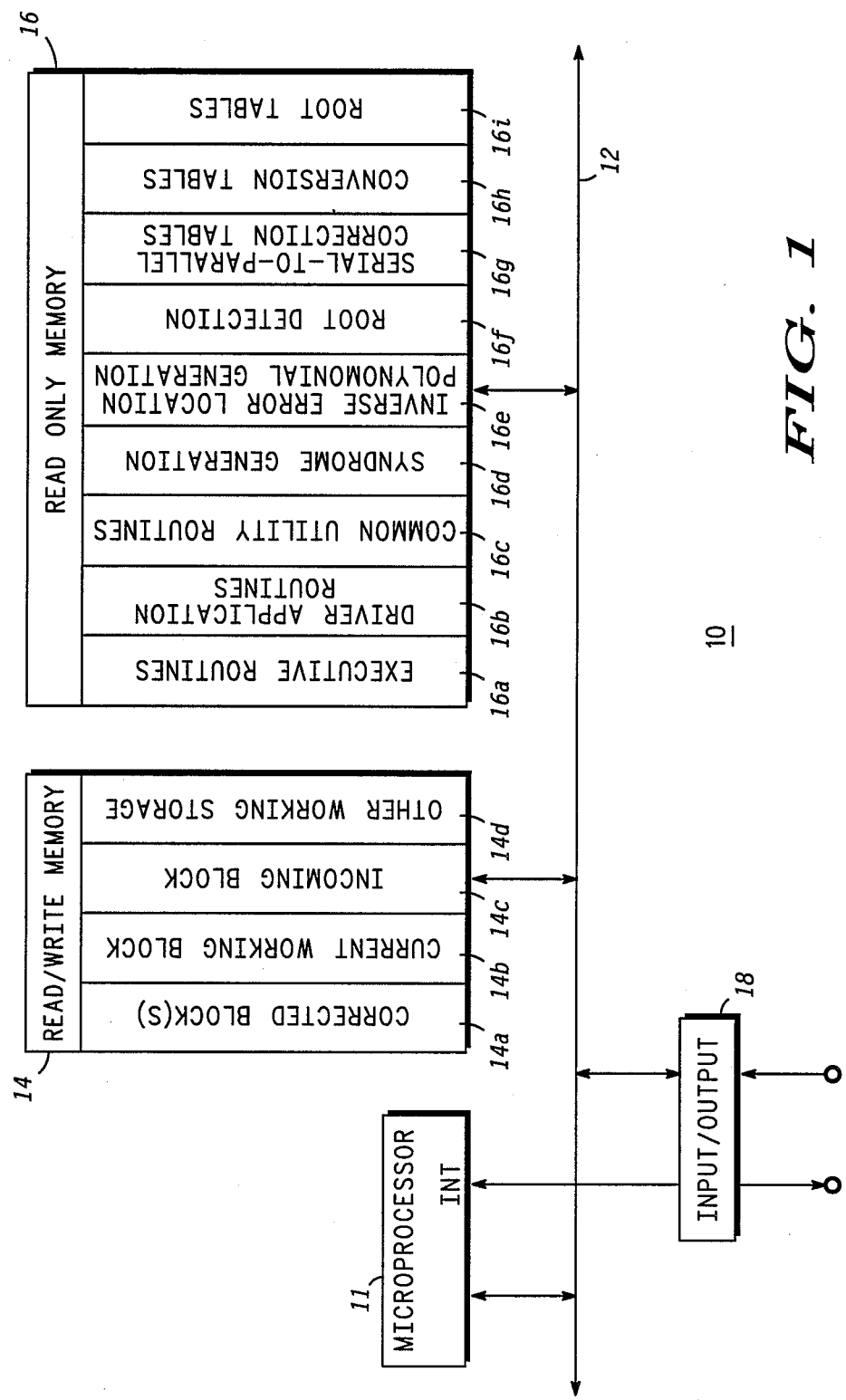
FIG. 1 shows a block diagram of a microprocessor based BCH decoder.

FIG. 1 shows a block diagram of the hardware utilized by a BCH decoder 10. In FIG. 1, a microprocessor 11 couples to a microprocessor bus 12. Microprocessor bus 12 includes all address, data, and control signals necessary for communicating between microprocessor 11 and other devices. A read/write (R/W) memory 14 represents one such device which couples to microprocessor bus 12. Additionally, a read-only-memory (ROM) represents another device which couples to microprocessor bus 12. Furthermore, an input/output circuit 18 couples to microprocessor bus 12. Additionally, input/output circuit 18 couples directly to an interrupt interface of microprocessor 11.

BCH decoder 10 partitions memory 14 and memory 16 into specific memory portions. For example, R/W memory 14 contains a corrected block(s) portions 14a. Corrected block(s) portion 14a contains completely decoded and corrected blocks of data which are awaiting further processing or transfer out of R/W memory 14. Those skilled in the art will recognize that the term block refers to a predetermined number of sequential bits from an input data stream over which BCH encoding has occurred. Furthermore, a corrected block may advantageously be transferred out from R/W memory 14 using input/output circuit 18 under control of microprocessor 11. If such corrected blocks are transferred out from R/W memory 14 serially, the interrupt interface between input/output circuit 18 and microprocessor 11 may be used to inform microprocessor 11 when input/output circuit 18 is available for receipt of new data.

R/W memory 14 additionally contains a current working block portion 14b. Current portion 14b contains blocks of input data which are undergoing a decoding process.

R/W memory 14 also contains an incoming block portion 14c and an other working storage portion 14d. Incoming block portion 14c may be used to store serial bits as they are being received by BCH decoder 10. Input/output circuit 18 has an input which is adapted to receive such serial information and pass such information to microprocessor 11 through R/W memory 14.

The interrupt interface between input/output circuit 18 and microprocessor 11 may be used to inform microprocessor 11 when a new bit of data is available from outside BCH decoder 10.

Other working storage portion 14d of R/W memory 14 is used for all other R/W memory requirements of microprocessor 11.

Portions 14a–14d may change in size and location within R/W memory 14 during operation of BCH decoder 10. For example, when BCH decoder 10 completes the decoding process for a current block of data, corrected block(s) portion 14a of R/W memory 14 may expand to include current working block 14b, incoming block 14c may change into current working block 14b, and a new incoming block 14c may be allocated from a portion of other working storage 14d.

The preferred embodiment utilizes a read-only-memory (ROM) for memory 16. However, those skilled in the art will recognize that a read/write memory could be adapted to serve the same purpose. ROM 16 contains data which is generally not intended to change during the operation of BCH decoder 10. This includes program data that instructs microprocessor 11 which instructions to perform and in what order to perform the instructions. Additionally, this includes tables which are utilized by microprocessor 11 when executing such programs.

ROM 16 is partitioned into several memory portions. For example, an executive routines portion 16a contains programs which permit microprocessor 11 to execute overhead-type routines which coordinate execution of various application routines. An other applications routines portion 16b contains data which serve as programs to microprocessor 11 for all routines which are not specifically related to BCH decoding. For example, such routines may relate to moving serial data into and out from input/output circuit 18 when microprocessor 11 receives interrupts from input/output circuit 18. A common utility routines portion 16c, contains data which represent the programs used by microprocessor 11 when microprocessor 11 executes routines that are used by more than one of the particular BCH decoding algorithms. Thus, common utility routines portion 16c contains computer programs which are not dedicated to one particular BCH routine.

A syndrome generation portion 16d of ROM 16 contains data that represent a program which microprocessor 11 executes when it calculates syndrome on data stored in current working block portion 14b or R/W memory 14. The term syndrome as used herein includes both a single syndrome value and multiple syndrome values.

An inverse error location polynomial generation portion 16e contains data which represent a program that microprocessor 11 executes when microprocessor 11 calculates an inverse error location polynomial utilizing a previously calculated syndrome.

Additionally, ROM 16 contains a root detection portion 16f which contains data that represent a program which microprocessor 11 executes to determine the roots of the inverse error location polynomial.

ROM memory 16 additionally contains memory portions which represent tables of data that are used by programs contained in syndrome generation portion 16d, inverse error location polynomial generation portion 16e, and root detection portion 16f of ROM 16. For example, serial-to-parallel correction tables 16g are utilized during syndome generation to convert several independent serially occurring bits into a single multi-bit field element. Conversion tables 16h are used to rapidly convert between binary and power forms of finite field elements during multiplication operations. Additionally, root tables 16i are used by the root detection program to eliminate multiplication operations and to rapidly find roots of the inverse error location polynomial.

BCH encoding and decoding rely heavily on a branch of mathematics called finite field theory. Finite field mathematics allows addition/subtraction and multiplication/division operations. Additionally, it supports associative and communicative properties. However, a "finite field" contains only a finite number of elements, and the result of any finite field arithmetic operation represents an element of the finite field. Thus, multiplication operations, for example, are modulo a maximum power of a primitive element &. For example, in a finite field (also called a Galios field) of $FG(2^4)$ a maximum power or index of & is 14, and $\&^{15} = \&^0 = 1$. Likewise, for a finite field $GF(2^8)$ a maximum power of & is 254 and $\&^{255} = \&^0 = 1$.

Furthermore, in finite field theory, $\&^0$ or 1 represents an identity element, but does not necessarily equal a binary 1. For example, in $GF(2^4)$ the identity $1 = 1000$ in binary, or "8" expressed as a hexidecimal number. Likewise, in $GF(2^8)$ the identity equals 1000 0000 in binary or "80" in hexidecimal notation. In finite field theory, all non-zero elements can be uniquely written as a particular power of &. Thus, a given unique field element may be described in either a binary form or in a power form. The power form represents a number to which & is raised to produce a result equaling a corresponding binary form.

Table 1, shown below, describes a mathematical representation of a syndrome vector S for a $GF(2^4)$ finite field resulting from a BCH(15,5), three-error correcting code. This BCH code contains 15 bits of data per block. Of the 15 bits of data, only 5 bits represent information bits and the remaining 10 bits represent parity bits. A BCH encoding process adds the remaining 10 bits to permit a BCH decoder to correct three or fewer errors which may occur in the 15-bit block of data. In this example, I=6 syndrome values are required in order to correct three errors. However, even numbered syndromes are easily derived from odd syndromes. Thus, only the three odd syndromes, S1, S3, and S5 are initially calculated using a received message vector T and a parity check matrix H. Received message vector T represents a block of BCH encoded data which decoder 10 (see FIG. 1) decodes.

TABLE 1

| S = [xxxxxxxxxxxxxxx*] | $\&^{14}$ | $\&^{12}$ | $\&^{10}$ |
|---|---|---|---|
| R | $\&^{13}$ | $\&^{9}$ | $\&^{5}$ |
|  | $\&^{12}$ | $\&^{6}$ | $\&^{0}$ |
|  | $\&^{11}$ | $\&^{3}$ | $\&^{10}$ |
|  | $\&^{10}$ | $\&^{0}$ | $\&^{5}$ |
|  | $\&^{9}$ | $\&^{12}$ | $\&^{0}$ |
|  | $\&^{8}$ | $\&^{9}$ | $\&^{10}$ |
|  | $\&^{7}$ | $\&^{6}$ | $\&^{5}$ |
|  | $\&^{6}$ | $\&^{3}$ | $\&^{0}$ |
|  | $\&^{5}$ | $\&^{0}$ | $\&^{10}$ |
|  | $\&^{4}$ | $\&^{12}$ | $\&^{5}$ |
|  | $\&^{3}$ | $\&^{9}$ | $\&^{0}$ |
|  | $\&^{2}$ | $\&^{6}$ | $\&^{10}$ |
|  | $\&^{1}$ | $\&^{3}$ | $\&^{5}$ |
|  | $\&^{0}$ | $\&^{0}$ | $\&^{0}$ |
|  | H | | |

*represents a dummy bit, forced to 0

Syndrome S1 results from a vector multiplication of the received message vector R by the first column of the parity check matrix H. Likewise, syndrome S3 and syndrome S5 are calculated by multiplying received message vector R by the second and third columns of parity check matrix H, respectively. Parity check matrix H represents a predetermined matrix of field elements which is readily obtained by those skilled in the art once a particular BCH code has been selected.

Syndrome S1 may also be represented as follows:
$$S1 = b_1 \&^{14} + b_2 \&^{13} = b_3 \&^{12} + \ldots + b_{14} \& + b_{15}. \quad \text{(Eq. 1)}$$
where $b_1$–$b_{15}$ represent the received bits with $b_1$ representing the first received bit and $b_{15}$ representing the last received bit. Additionally, by manipulating Eq. 1, an equivalent equation may be shown as:

$$\begin{aligned} S1 = &[[[b_1 \&^2 + b_2 \&^1 + b_3 \&^0 + b_4 \&^{-1}] \&^4 + \\ & b_5 \&^2 + b_6 \&^1 + b_7 \&^0 + b_8 \&^{-1}] \&^4 + \\ & b_9 \&^2 + b_{10} \&^1 + b_{11} \&^0 + b_{12} \&^{-1}] \&^4 + \\ & b_{13} \&^2 + b_{14} \&^1 + b_{15} \&^0 . \end{aligned} \quad \text{(Eq. 2)}$$

Figure 2:
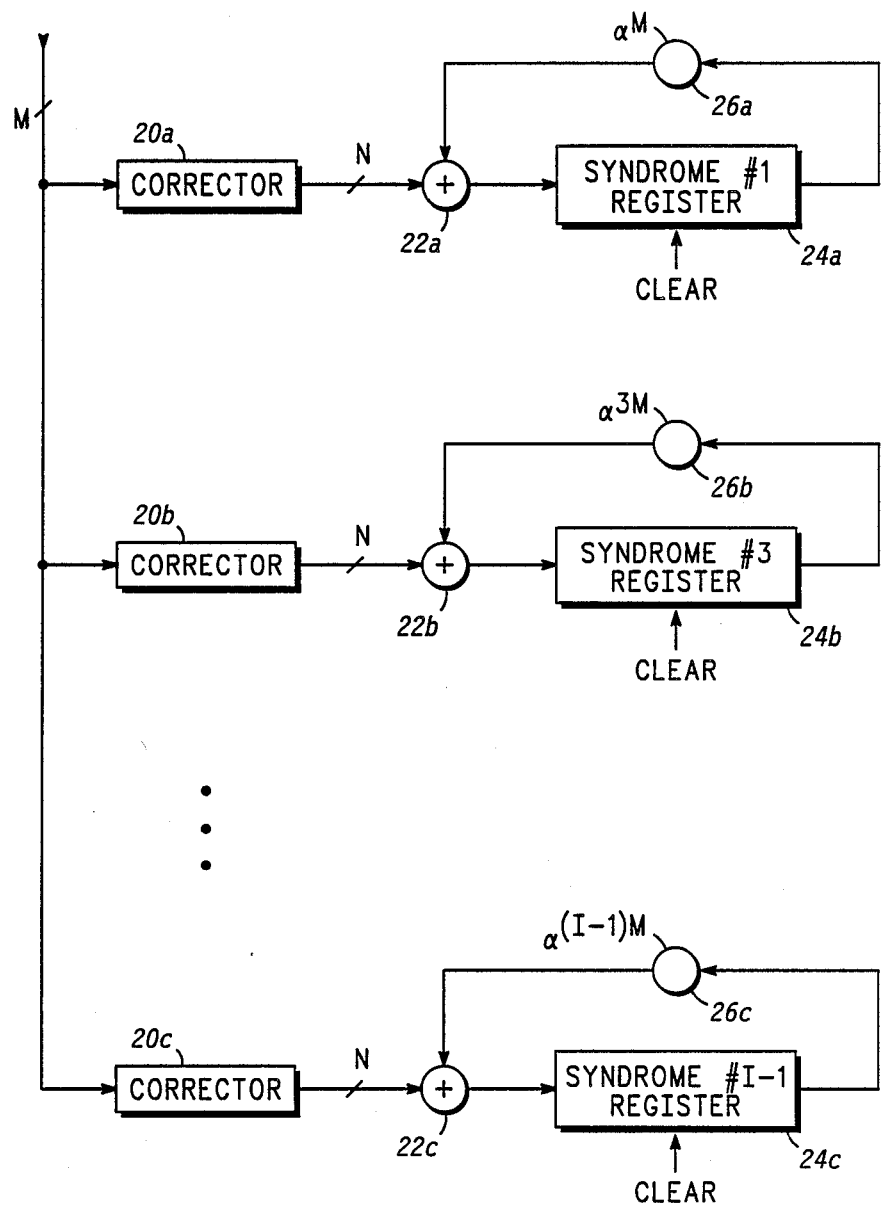
FIG. 2 shows a process diagram of a syndrome generation portion of the BCH decoder.

The present invention implements a syndrome generation process which follows the requirements of Eq. 2 as shown in the process flow diagram of FIG. 2. This implementation causes microprocessor 11 (see FIG. 1) to process M bits in parallel rather than processing single bits of the received message vector R individually. In the BCH(15,5) example, M may equal 4. Thus, bits from received input vector R are grouped into M-bit groups where M is greater than 1. Each of these groups represents a tier of bits. These M-bit tiers are then transformed through correctors 20a, 20b, and 20c so that transformed through correctors 20a, 20b, and 20c so that a resulting transformed value represents a single N-bit field element for each tier.

The syndrome generation process utilizes these transformed N-bit field elements in a feedback-multiply-add process. Syndrome registers 24a, 24b, and 24c are initialized prior to the start of a syndrome calculation so that they exhibit the zero field element (0000 GF($2^4$) or 0000 0000 GF($2^8$)). The field elements which are stored in syndrome registers 24a-24c, are multiplied by a constant field element $\&^{(iM)}$, where i represents the number of the syndrome being calculated, as shown at multiplier steps 26a, 26b, and 26c, respectively. These multiplier steps represent finite field multiplication operations. Steps 22a, 22b, and 22c perform a finite field addition of the N-bit transformed field elements output from correctors 20a, 20b, and 20c with the results generated by steps 26a, 26b, and 26c, respectively. Those skilled in the art will recognize that finite field addition represents a logical Exclusive OR operation which is easily performed using a microprocessor, such as microprocessor 11 (see FIG. 1). Outputs from adder steps 22a, 22b, and 22c then update syndrome registers 24a, 24b, and 24c, respectively. Next, a new feedback-multiply-add process occurs utilizing the updated syndrome field elements and a subsequent M-bit tier of input data. This cycle repeats until all bits in a block of received data have been processed through the syndrome calculation. When all M-bit tiers have been processed in the syndrome calculation routine, field elements which are stored in syndrome registers 24 represent the syndromes.

Syndromes may be calculated either serially or in parallel. With serial calculation, microprocessor 11 (see FIG. 1) first calculates syndrome number 1 using corrector step 20a, adder step 22a, syndrome register step 24a, and multiplier step 26a. Then, microprocessor 11 calculates syndrome 3 using corrector step 20b, adder step 22b, syndrome register step 24b, and multiplier step 26b. In a BCH(15,5) code the last syndrome number is 5. This last syndrome is calculated using corrector step 20c, adder step 22c, syndrome register step 24c, and multiplier step 26c. With parallel calculations, one feedback-multiply-add process occurs for each syndrome before subsequent feedback-multiply-add processes occur.

In larger codes additional syndromes are calculated. For example, in BCH(255,131) I=36 snydromes are required for correction of up to 18 errors in the 255-bit block of data. Thus, for BCH(255,131) 15 intervening syndrome calculations occur using steps similar to those described above but using different correctors in corrector steps 20 and different finite field element constants in multiplier steps 26. for BCH(255,131) steps 20c, 22c, 24c, and 26c calculate syndrome number 35.

Figure 3:
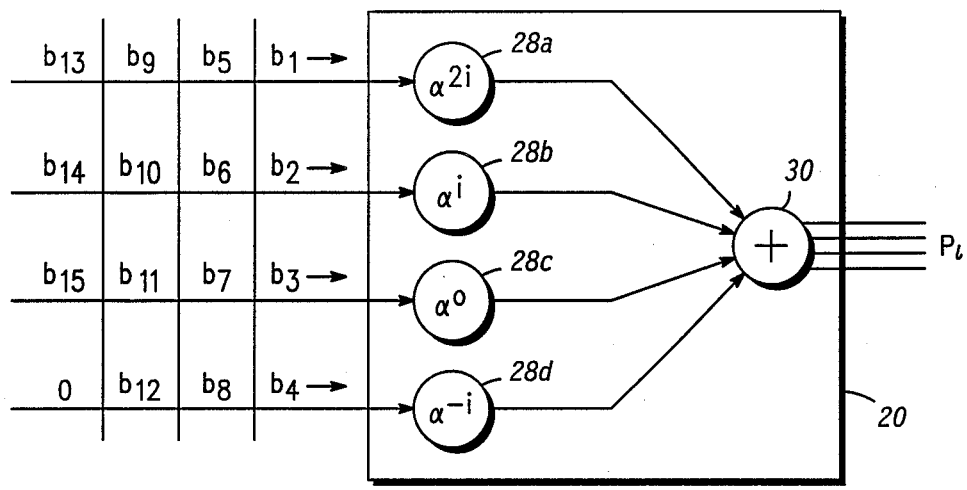
FIG. 3 shows a first embodiment of a corrector portion of the syndrome generation process shown in FIG. 2.
Figure 4:
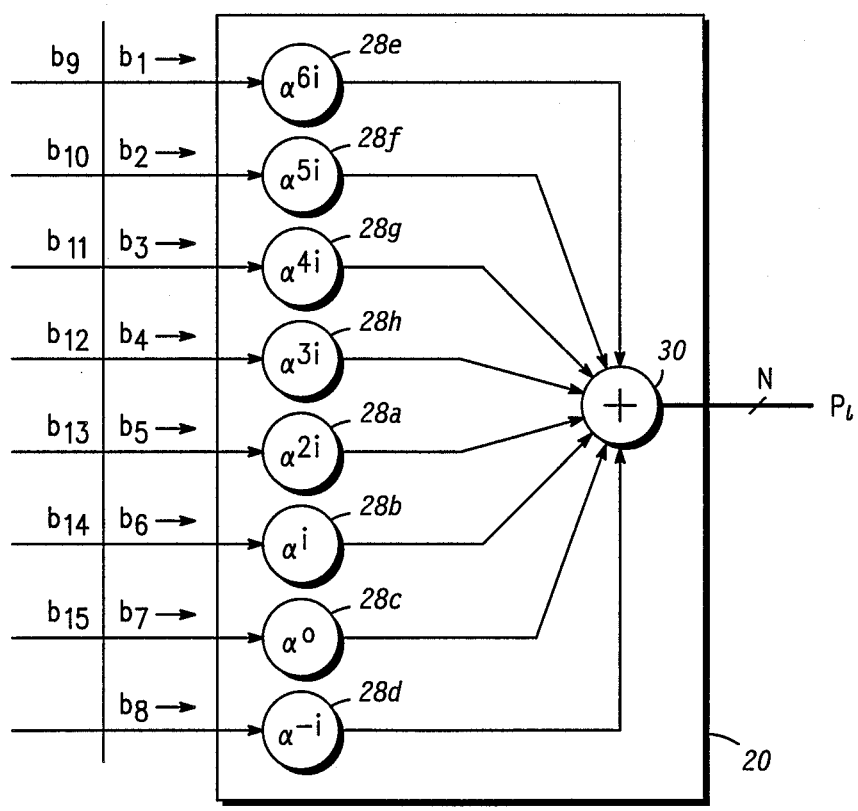
FIG. 4 shows a second embodiment of a corrector portion of the syndrome generation process shown in FIG. 2.

FIG. 3 and 4 show two embodiments of a corrector 20. In the FIG. 3 embodiment, bits from the input block of data are received in 4-bit tiers, and the output from corrector 20 provides a 4-bit finite field element for each tier of data provided at the input. The preferred embodiment implements corrector 20 of FIG. 3 by a table lookup operation which uses a table having 16, 4-bit data items. This table has been previously programmed to provide the correction factors for all possible bit combinations of any 4-bit tier. Each syndrome requires its own corrector 20, therefore one table in ROM 16 (see FIG. 1) exists for each syndrome being calculated. FIG. 1 shows these tables collectively as memory portion 16g.

The FIG. 3 embodiment of corrector 20 corrects a BCH(15,5) code having GF($2^4$) field elements. The data items programmed into the tables which make up correctors 20 result from applying the steps shown in the FIG. 3 to all bit combinations of 4-bit tiers. In general, M successive bits of the input data stream are multiplied by $\&^{(M-2)i}$, $\&^{(M-3)i}$, ..., $\&^i$, $\&^0$, $\&^{(-1)i}$, where i equals the number of the syndrome being calculated. Thus, in FIG. 3, a first bit is multiplied by a field element equal to $\&^{2i}$ in a step 28a to produce a first product. A second bit is multiplied by a field element $\&^i$ in a step 28b to produce a second product. Likewise, a third bit is multiplied by a field element equal to $\&^0$, or the identity element, in a step 28c to produce a third product. Finally, a fourth bit is multiplied by a field element $\&^{-i}$ in a step 28d to produce a fourth product.

The first bit represents bit $b_1$ in the first tier, bit $b_5$ in the second tier, $b_9$ in the third tier, and bit $b_{13}$ in the fourth tier. Similarly, the second and third bits represents bits $b_2$ and $b_3$ in the first tier, bits $b_6$ and $b_7$ in the second tier, bits $b_{10}$ and $b_{11}$ in the third tier, and bits $b_{14}$ and $b_{15}$ in the fourth tier. The fourth bit represents bits $b_4$, $b_8$ and $b_{12}$ in tiers one, two and three. Since the BCH(15,5) code used in this example contains only 15 bits per block, the last bit of the last tier represents a dummy bit which microprocessor 11 (see FIG. 1) forces to equal 0. By forcing the dummy bit to equal 0, an output $P_i$ from corrector 20 is unaffected by the dummy bit.

The first, second, third, and fourth products from multiplier steps 28a, 28b, 28c, and 28d, respectively, are added together in a finite field addition operation at an add step 30. The results from this finite field addition provide output $P_i$ from corrector 20. Table 2 (shown below) defines the above-described output from corrector 20 for all combinations of input bits for correctors 20 which generate syndromes 1, 3, and 5 in a BCH(15,5) code. Such tables are stored within correction table 16g (see FIG. 1) within ROM 16. Microprocessor 11 performs the correction process by doing a table lookup operation on the appropriate syndrome table for the particular syndrome being calculated. This table lookup operation uses a tier of the input stream as a table offset to the tables which represent correctors 20.

TABLE 2

BINARY
Bit No.
*FED — fourth tier
CBA9 — third tier
8765 — second tier
4321 — first tier

| | $P_1$ | $P_3$ | $P_5$ |
|---|---|---|---|
| 0 (0000) | 0 | 0 | 0 |
| 1 (0001) | 2 | 3 | E |
| 2 (0010) | 4 | 1 | 6 |
| 3 (0011) | 6 | 2 | 8 |
| 4 (0100) | 8 | 8 | 8 |
| 5 (0101) | A | B | 6 |
| 6 (0110) | C | 9 | E |
| 7 (0111) | E | A | 0 |
| 8 (1000) | 9 | F | E |
| 9 (1001) | B | C | 0 |
| A (1010) | D | E | 8 |
| B (1011) | F | D | 6 |
| C (1100) | 1 | 7 | 6 |
| D (1101) | 3 | 4 | 8 |
| E (1110) | 5 | 6 | 0 |
| F (1111) | 7 | 5 | E |

*represents a dummy bit, which exhibits a value of 0.

FIG. 4 shows an embodiment of a corrector 20 which may be used with M=8 bits. In the FIG. 4 embodiment, a first bit, $b_1$, in the first tier, is multiplied by a constant value of $\&^{6i}$, where i represents the number of the syndrome being calculated. This occurs in a step labeled 28e. In a step 28f, bit $b_2$ from the first tier, is multiplied by a constant value equal to $\&^{5i}$, and in a step 28g, bit $b_3$ from the first tier, is multiplied by a constant value equal to $\&^{4i}$. In a step 28h, bit $b_4$ from the first tier is multiplied by a constant value equal to $\&^{3i}$. Likewise, in a step 28a, bit $b_5$ from the first tier is multiplied by a constant value equal to $\&^{2i}$, and in a step 28b, bit $b_6$ from the first tier in multiplied by a constant value equal to $\&^i$. In a step 28c, bit $b_7$ in the first tier is multiplied by a constant equal to $\&^0$, or the identity element. Finally, in a step 28d, bit $b_8$ from the first tier is multiplied by a constant value equal to $\&^{-1}$. The products obtained from steps 28a-28h are added together in a finite field addition operation at a step 30 which provides output $P_i$ from corrector 20.

In a BCH(15,5) code, processing speed improves over the processing speed that results from the use of the corrector shown in FIG. 3 because only two tiers are needed in order to process an entire block of input data. However, the table size for each corrector 20 increases to a length of 256 data items with each data item being N =4 bits wide because 256 different possible bit combinations exist for an 8-bit input tier.

Furthermore, the FIG. 4 embodiment of corrector 20 represents a corrector which may be utilized with a BCH(255,131) code that utilizes a GF($2^8$) finite field. For the BCH9255,131) code, 32, 8-bit tiers of input data must be processed in order generate a single syndrome. Furthermore, the output for corrector 20 represents an 8-bit finite field element for each tier of input data. In other words, N=8 for a BCH(255,131) example. For the BCH(255,131) code, 18 of correctors 20 are required in order to generate the 36 syndromes required by this code. Consequently, 18 corrector tables for the BCH(255,131) code collectively required 4,608, 8-bit data items.

After calculations of odd syndrome, even syndrome are easily calculated using $$S_{(i-1)} = S^2_{(i-1)/2} \quad (Eq.3)$$

where i=syndrome number.

After syndrome calculation the process performed by BCH decoder 10 (see FIG. 1) next generates an inverse error location polynomial. The present invention contemplates the use of a conventional algorithm to generate this polynomial. For example, the present invention implements an algorithm known to those skilled in the art as the Berlekamp/Massey algorithm. This algorithm utilizes the syndrome previously calculated in the syndrome generation process. A straight forward routine which implements the Berlekamp/Massey algorithm is programmed into portion 16e of ROM 16, as shown in FIG. 1.

Such routines typically require a significant amount of finite field multiplication operations in order to generate the inverse error location polynomial. These multiplications are similar to multiplication steps 26 shown in FIG. 2. In order to multiply two finite field elements together, the present invention converts the two field elements into their power forms, and adds the power forms together to obtain a power form sum. Then, the power form sum is converted back into a binary finite field element.

The present invention uses tables in connection with table lookup operations for such binary-power and power-binary conversions. Such tables are shown below for a GF($2^4$) field.

TABLE 3

| OFFSET | POWER |
|---|---|
| 0 (0000) | * |
| 1 (0001) | $\&^3$ (0011) |
| 2 (0010) | $\&^2$ (0010) |
| 3 (0011) | $\&^6$ (0110) |
| 4 (0100) | $\&^1$ (0001) |
| 5 (0101) | $\&^9$ (1001) |
| 6 (0110) | $\&^5$ (0101) |
| 7 (0111) | $\&^{11}$ (1011) |
| 8 (1000) | $\&^0$ (0000) |
| 9 (1001) | $\&^{14}$ (1110) |
| A (1010) | $\&^8$ (1000) |
| B (1011) | $\&^{13}$ (1101) |
| C (1100) | $\&^4$ (0100) |
| D (1101) | $\&^7$ (0111) |
| E (1110) | $\&^{10}$ (1010) |
| F (1111) | $\&^{12}$ (1100) |

*represents —infinity but is encoded as: (1111)

Table 3 shows an example conversion table which permits a table lookup operation that converts a binary field element into a corresponding power form. For this conversion, the binary field element serves as an offset into the table which contains the data items shown in the power column of Table 3. A particular data item referenced by a binary field element used as an offset represents the power (or index) to which & must be raised in order for the result to equal this binary field element.

TABLE 4

| OFFSET | BINARY |
|---|---|
| * | 0 (0000) |
| $\&^0$ (0000) | 8 (1000) |
| $\&^1$ (0001) | 4 (0100) |
| $\&^2$ (0010) | 2 (0010) |
| $\&^3$ (0011) | 1 (0001) |
| $\&^4$ (0100) | C (1100) |
| $\&^5$ (0101) | 6 (0110) |
| $\&^6$ (0110) | 3 (0011) |
| $\&^7$ (0111) | D (1101) |
| $\&^8$ (1000) | A (1010) |
| $\&^9$ (1001) | 5 (0101) |
| $\&^{10}$ (1010) | E (1110) |
| $\&^{11}$ (1011 | 7 (0111) |
| $\&^{12}$ (1100) | F (1111) |
| $\&^{13}$ (1101) | B (1011) |
| $\&^{14}$ (1110) | 9 (1001) |

*represents —infinity, encoded as: (1111)

Table 4 shows a conversion table used in a table lookup operation which converts power forms of field elements into corresponding binary field elements. In this table lookup operation, the offset for the table represents a power of &. The data items stored at the indicated table offsets represent the binary field elements which result from raising & to the indicated powers. Accordingly, by utilizing table lookup operations field, elements may be converted from binary forms into power forms and from power forms into binary forms by microprocessor 11 (see FIG. 1) in a single memory access operation.

Although Tables 3 and 4 show conversion tables for a GF($2^4$) finite field, those skilled in the art will recognize that different finite fields will benefit from the use of such tables as well. For example, in a BCH(255,131) code which utilizes a GF($2^8$) finite field, each table is 256 data items long, and each data item represents an 8-bit field element. Accordingly, for the BCH(255,131) code, 512 bits of memory are required for these two conversion tables. Such conversion tables are collectively shown at memory portion 16h in FIG. 1.

The inverse error location polynomial generation process produces a polynomial which represents a sum of terms wherein the terms each exhibit a unique order. This polynomial may be represented in the form:

$$C(D) = 1 + C_1 D + C_2 D^2 + \ldots + C_{I/2} D^{I/2} \quad \text{(Eq. 4)}$$

when a maximum numbers of errors are detected. The additions and multiplications in Eq. 4 represent finite field operations, $C_1, C_2, \ldots, C_{I/2}$ represent field element coefficients which have been generated by the inverse error location polynomial generation process, I represents the total number of syndromes required by a particular BCH code, and D represents a finite field element variable. When less than the maximum number of errors are detected, the inverse error location polynomial resembles Eq. 4, except that the highest order of the polynomial represents the number of bit errors detected in the block of data.

Errors occurring in the input data stream may be located by solving Eq. 4 for its roots. The power form of those field elements which cause Eq. 4 to equal 0 describes the inverse of the location of correctable bit errors. In other words, the inverse of the power to which & must be raised in order for the resulting field element to equal a value of D which causes Eq. 4 to equal 0, equals the position of the bit which is in error. For example, in a BCH(15,5) code, if an inverse error location polynomial is $1 + \&^3 D$, then a root of this inverse error location polynomial would be $\&^{12}$ because $D = \&^{12}$ causes this inverse error location polynomial to equal 0. Consequently, bit number 3 is indicated as being in error because $\&^3$ represents the inverse of $\&^{12}$.

The present invention contemplates the performance of an algorithm known to those skilled in the art as a Chien search to detect the inverse error location polynomial roots. In general, a Chien search substitutes all possible values of D into the inverse error location polynomial in order to identify those field element values which cause the inverse error location polynomial to equal 0. If detection of a greater number of errors than the BCH code is designed to correct is desired, then field element values corresponding to each bit position contained in a block of input data (i.e. 15 field elements for BCH(15,5) or 255 field elements for BCH(255,131)) must be substituted for D in Eq. 4. However, if only error correction on the information bits of the block of data is required, then only field element values corresponding to bit positions containing the information portion of the block need to substituted for D.

Figure 5:
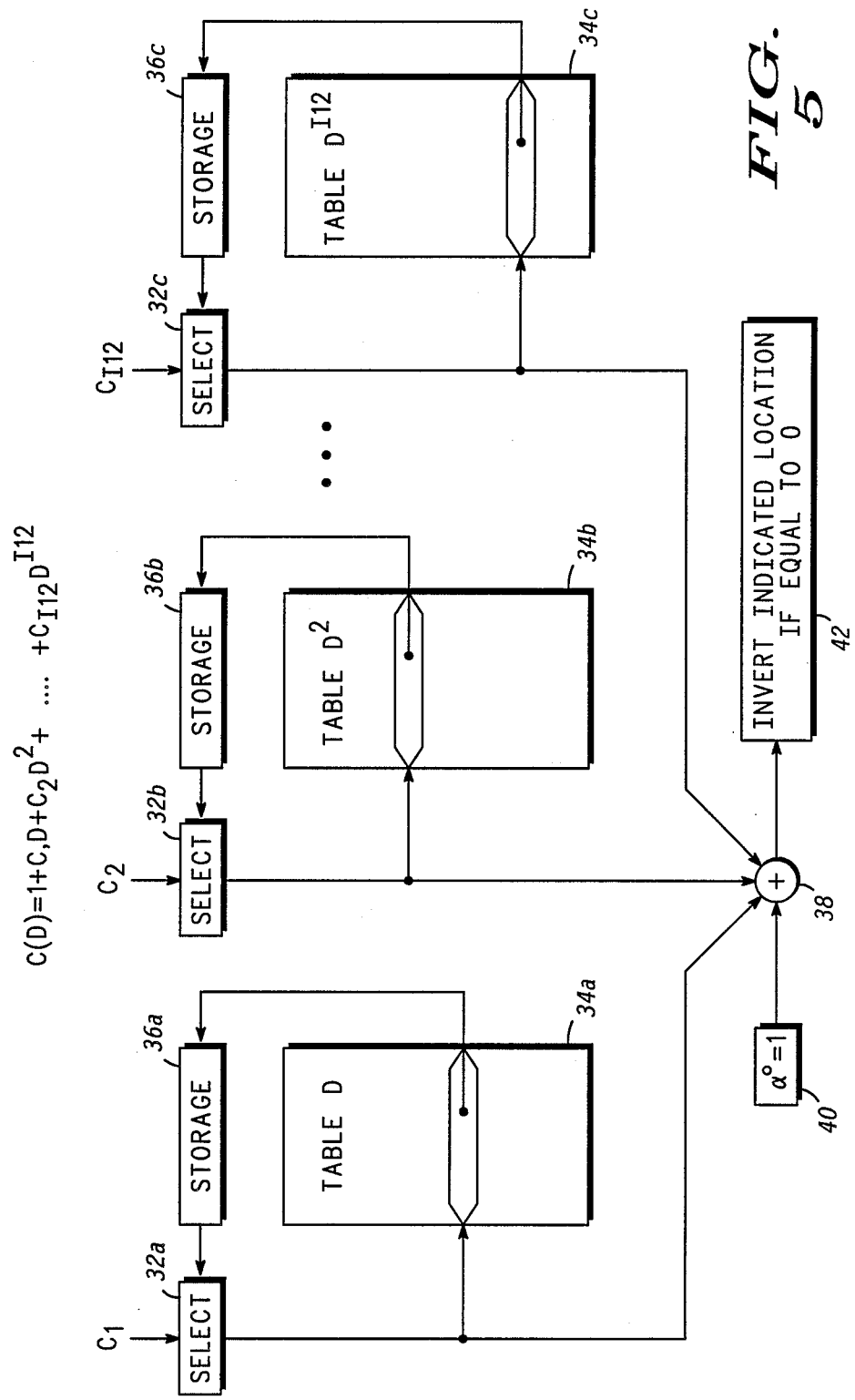
FIG. 5 shows a process diagram of a root detection portion of the BCH decoder.

FIG. 5 shows the process utilized by microprocessor 11 (see FIG. 1) in implementing the Chien search. Selection steps 32 decide whether to utilize the field element coefficients from the inverse error location polynomial or a field element from storage locations 36 as an offset to tables 34 and as inputs to an adder step 38. Outputs from table lookup operations that utilize tables 34 are saved in storage locations 36. Specifically, adder step 38 receives inputs from a constant value of $\&^0$ (the identity element) supplied by a step 40 and from selection step 32a, which corresponds to the $C_1 D$ term or product of Eq. 4. Additionally, adder 38 receives an input from selection step 32b, which corresponds to the $C_2 D^2$ product of Eq. 4, and from selection step 32c, which corresponds to the $C_{I/2} D^{I/2}$ product of Eq. 4. Table 34a receives an offset or address input from selection step 32a and provides an output as a result of a table lookup operation to a storage step 36a. Table 34b receives an offset from selection step 32b and, through a table lookup operation, provides an output to a storage step 36b. Likewise, table 34c receives an offset input from selection step 32c and, through a table lookup operation, provides an output to a storage step 36c. Storage steps 36a, 36b, and 36c each provide an output to selection steps 32a, 32b and 32c, respectively.

All selection steps 32 choose the coefficient from Eq. 4 at a first iteration of the process indicated in FIG. 5. Thus, the first iteration effectively substitutes $\&^0$ for D in Eq. 4, and selection steps 32 provide resulting product terms from Eq. 4. Adder step 38 then performs a finite field addition of these product terms and the constant 1 to solve the inverse error location polynomial for the case of $D = \&^0$.

If the result of the finite field addition is a 0, then $\&^0$ represents a root to the inverse error location polynomial, and the inverse of $\&^0$ corresponds to the bit position in which an error has been detected. In BCH(15,5), this situation indicates the occurrence of an error in bit 15, since $\&^{15}$ is the inverse of $\&^0$ in GF($2^4$). In BCH(255,131), this situation indicates that bit 255 is in error since $\&^{255}$ represents the inverse of $\&^0$ in GF($2^8$). However, those skilled in the art will recognize that an inversion could alternatively occur at transmission of the BCH code. If such an inversion occurs at the transmission, then the first iteration would correspond to the first bit received at BCH decoder 10 (see FIG. 1). bits that are indicated as being in error are inverted in a step 42 to correct the error.

During this first iteration, table lookup operations are performed using each of tables 34. The contents of tables 34 which are addressed by the coefficients from the first iteration are moved from tables 34 to storage locations 36 where they are used in the next iteration of the process indicated in FIG. 5.

During the second and all subsequent iterations of the FIG. 5 process, selection steps 32 choose field element values received from storage locations 36. Thus, the contents obtained from tables 34 provide the individual product terms of Eq. 4 in subsequent iterations of the FIG. 5 process. In the second iteration, these individual product terms and the offsets used to address Table 4 are therefore defined by the contents of tables 34 in the previous iteration.

TABLE 5

| OFFSET | D(34a) | $D^2$(34b) | $D^3$(34c) |
|---|---|---|---|
| 0 (&$^{-}$inf) | | | |
| 1 (&$^3$) | D (&$^4$) | 6 (&$^5$) | 3 (&$^6$) |
| 2 (&$^2$) | 1 (&$^3$) | C (&$^4$) | 6 (&$^5$) |
| 3 (&$^6$) | D (&$^7$) | A (&$^8$) | 5 (&$^9$) |
| 4 (&$^1$) | 2 (&$^2$) | 1 (&$^3$) | C (&$^4$) |
| 5 (&$^9$) | E (&$^{10}$) | 7 (&$^{11}$) | F (&$^{12}$) |
| 6 (&$^5$) | 3 (&$^6$) | D (&$^7$) | A (&$^8$) |
| 7 (&$^{11}$) | F (&$^{12}$) | B (&$^{13}$) | 9 (&$^{14}$) |
| 8 (&$^0$) | 4 (&$^1$) | 2 (&$^2$) | 1 (&$^3$) |
| 9 (&$^{14}$) | 8 (&$^0$) | 4 (&$^1$) | 2 (&$^2$) |
| A (&$^8$) | 5 (&$^9$) | E (&$^{10}$) | 7 (&$^{11}$) |
| B (&$^{13}$) | 9 (&$^{14}$) | 8 (&$^0$) | 4 (&$^1$) |
| C (&$^4$) | 6 (&$^5$) | 3 (&$^6$) | D (&$^7$) |
| D (&$^7$) | A (&$^8$) | 5 (&$^9$) | E (&$^{10}$) |
| E (&$^{10}$) | 7 (&$^{11}$) | F (&$^{12}$) | B (&$^{13}$) |
| F (&$^{12}$) | B (&$^{13}$) | 9 (&$^{14}$) | 8 (&$^0$) |

Table 5 shows a definition for data items stored in tables 34a, 34b, and 34c for a BCH(15,5) code example. Each data item stored in table 34a represents & times the offset or address of that data item. Both the offset and the data item itself are expressed in binary form. Each data item in table 34b represents &$^2$ times the offset of that data item, and each data item in 34c represents &$^3$ times the offset of that data item. The three tables defined in Table 5 above each contain 16, 4-bit data items which are programmed into memory portion 16i of ROM 16 (see FIG. 1). However, if a BCH(255,131) code is utilized, then each table contains 256, 8-bit data items and 18 tables are required because BCH(255,131) corrects up to 18 errors. Thus, a total of 8-bit data items of memory are required in memory portion 16i (see FIG. 1) for root tables located in memory portion 16i, shown in FIG. 1.

In the second iteration of the FIG. 5 process, the individual product terms equal &, &$^2$, and &$^3$ times each of the $C_1$, $C_2$, and $C_{I/2}$ coefficients, respectively, of Eq. 4. Accordingly, the second iteration effectively substitutes 7 for D in Eq. 4. If the result of addition step 38 in the second iteration equals 0, then the bit which resides adjacent the previously tested bit is inverted to correct an error. The above steps are repeated and all subsequent iterations until the entire Chien search has been completed.

Since the present invention implements the FIG. 5 process using microprocessor 11 (see FIG. 1), the individual product term generation steps and addition step 38 are not performed in parallel. Rather, the present invention contemplates utilizing either on "inner loop" of coefficient terms and an "outer loop" which cycles through possible D values or vice versa. With coefficient terms calculated in an inner loop, the FIG. 5 process obtains all products terms for a given value of D before that value of D is changed.

However, an inner loop which cycles through all possible values of D and an outer loop which calculates coefficient terms first causes generation of all values of D for a given coefficient. This entire set of coefficients using all values of D is saved in memory 14 (see FIG. 1). Then, product terms for all values of D for a next coefficient are obtained and added (logical Exclusive OR operation) to prior saved product terms. This process continues until all coefficient terms have been calculated. At completion, the saved terms are examined to determine which ones are equal to 0. Offsets or addresses of those memory locations which equal 0 indicate which bits are in error.

Thus, the present invention represents a microprocessor based BCH decoder. Since it is a microprocessor based BCH decoder, it is relatively inexpensive, flexible, reliable, and utilizes a relatively small amount of power due to the low number of parts required for construction for such a microprocessor based system. Due to the correctors utilized in connection with syndrome generation, portions of a serially occurring input data stream are processed in parallel. Increased speed results. Due to the construction of various tables in memory and the utilization of such tables by microprocessor 11 in performing syndrome generation, inverse error location polynomial generation, and root detection algorithms, execution speed increases further. The preferred embodiment of the present invention decodes BCH(255,131) occuring at a 2400 band rate in real time utilizing a MC6303, 8-bit microprocessor, manufactured by Motorola, Inc.

The present invention is described with reference to particular embodiments which facilitate teaching the invention. Those skilled in the art will recognize that many alternative embodiments also fall within the scope of the present invention. For example, other BCH codes than the examples presented herein may be used in connection with the present invention. ADditionally, the microprocessor described herein may represent any controlling, computing, or computer device whether it is contained on one or more integrated circuit chips so long as such devices function similarly to a conventional microprocessor. Still further, addresses or offsets to tables discussed herein contemplate the incorporation of minor, logical or arithmetic operations performed on such offsets or table addresses. Such minor operations may represent inversions or the addition of base addresses of tables to the addresses and offsets described above. These and other changes and modifications to the above-described preferred embodiment which are obvious to those skilled in the art are intended to be included within the scope of the present invention.

We claim:

1. An apparatus for decoding a stream of BCH encoded data, said apparatus comprising:
    a microprocessor for performing said decoding of said stream of said BCH encoded data;
    means for coupling the stream of BCH encoded data to said microprocessor; and
    means, coupled to said microprocessor, for converting M successive bits of the input data stream into N-bit finite field elements so that a syndrome representative of the serial stream of data may be calculated by said microprocessor utilizing the N-bit values, where M and N each represent positive integer numbers greater than 1.

2. An apparatus as claimed in claim 1 wherein said converting means comprises a first portion of a memory addressable by the M successive bits of the input data stream and having $2^M$, N-bit data items stored therein and arranged so that the value of each data item equals a finite field addition of M finite field products, where each of the M products represents the result of a finite field multiplication between one of the M successive bits of the input data stream and one of M predetermined field elements.

3. An apparatus as claimed in claim 2 additionally comprising $(I/2) - 1$ unique portions of memory, where I represents the number of syndromes being calculated, and wherein:
   each of the $(I/2) - 1$ portions is addressable by the M successive bits of the input data stream and has $2^M$, N-bit data items stored therein and arranged so that the value of each data item equals a finite field addition of M finite field second-products, where each of the M second-products represents the result of a finite field multiplication between one of the M successive bits of the input data stream and one of M predetermined field elements; and
   each of the $(I/2) - 1$ portions is untilized by said microprocessor to generate one of $(I/2) - 1$ syndromes.

4. An apparatus as claimed in claim 3 wherein data items within the first and $(I/2) - 1$ portions of memory are arranged utilizing $\&^{(M-2)i}, \&^{(M-3)i}, \ldots, \&^i, \&^0, \&^{(-1)i}$, where i equals the number of the syndrome being calculated, as a representation of the predetermined field elements.

5. An apparatus as claimed in claim 1 additionally comprising:
   means, coupled to said microprocessor, for calculating an inverse error location polynomial utilizing the syndrome;
   first means, coupled to said microprocessor, for converting finite field binary elements into power forms of the binary elements; and
   second means, coupled to said microprocessor, for converting finite field power elements into binary forms of the power elements.

6. An apparatus as claimed in claim 5 wherein said first means for converting comprises a portion of memory having data items addressable by binary finite field elements so that each data item represents a power form of a binary finite field element which addresses the data item.

7. An apparatus as claimed in claim 5 wherein the inverse error location polynomial is expressed as a sum of terms, each of which exhibit a unique order, and said apparatus additionally comprises:
   means, coupled to said microprocessor, for locating roots of the inverse error location polynomial; and
   a unique portion of a memory for each of the terms of the polynomial wherein each portion of memory is coupled to said microprocessor and addressable by a field element which represents a coefficient of the polynomial term for which a respective memory portion applies, each portion of memory having data items stored therein so that the value of each data item equals $D \times \&^i$, where D represents the set of all possible coefficient values and i represents the order of the term for which a respective memory portion applies.

8. An apparatus as claimed in claim 7 wherein each of said memory portions contains data items representing binary forms of field elements, and the coefficients which address each memory portion are expressed in binary forms.

9. A method of decoding a serially occurring stream of BCH encoded data, said method comprising the steps of:
   calculating syndrome for BCH encoded said data by converting M successive bits of the BCH encoded data stream into N-bit values and manipulating the N-bit values into a syndrome, where M and N represent positive integer numbers greater than 1;
   generating an inverse error location polynomial utilizing syndrome from said calculating step;
   detecting roots of the polynomial from said generating step; and
   inverting bits in the data stream which correspond to roots found in said detecting step.

10. A method as claimed in claim 9 wherein said calculating step comprises the step of performing a table look-up operation using the M successive bits of the input data stream as a table offset, said performing step being for applying correction factors which permit subsequent manipulation of the M successive bits in parallel.

11. A method as claimed in claim 10 wherein one of said calculating and generating steps multiplies two binary field elements together utilizing the steps of:
   converting the two binary field elements into two corresponding power form field elements through two table lookup operations that utilize the two binary field elements, respectively, as table offsets;
   adding the two power form field elements together to produce a single power form field element sum; and
   converting the power form field element sum from said adding step into a corresponding binary field element through a table lookup operation that utilizes the power form field element sum as a table offset.

12. A method as claimed in claim 11 wherein the inverse error location polynomial represents a sum of a plurality of products wherein each products represents the multiplication of a coefficient by a variable raised to a power and wherein said finding step comprises the step of obtaining the products utilizing one table lookup operation for each product wherein tables used by the lookup operations of said obtaining step have data items stored therein equaling $D \times \&^i$ wherein D represents the set of all possible coefficients and i represents the power of the variable in the product for which the table applies.

13. A method as claimed in claim 12 wherein said obtaining step comprises the step of addressing the tables of said obtaining step utilizing data items retrieved from respective tables in immediately previous lookup operations as an offset in a current lookup operation.

14. An apparatus for decoding a serially occurring stream of BCH encoded data, said apparatus comprising:
   a microprocessor;
   means for coupling the stream of BCH encoded data to said microprocessor;

means, coupled to said microprocessor, for converting M successive bits of the input data stream into N-bit values so that I/2 syndromes representative of the serial stream of data may be calculated by said microprocessor utilizing the N-bit values, where I, M, and N each represent positive integer numbers greater than 1;

means, coupled to said microprocessor, for generating an inverse error location polynomial utilizing the syndrome, the inverse error location polynomial being characterized as representing a finite field sum of a plurality of products wherein each product represents a finite field multiplication of a coefficient by a variable raised to a power;

means, coupled to said microprocessor, for finding roots of the polynomial; and a memory, coupled to said microprocessor, and partitioned into memory portions wherein:

I/2 unique correction memory portions are each addressable by the M successive bits of the input data stream and each contains correction data items arranged so that the value of each correction data item equals a finite field addition of M field element products, where each of the M products represents the result of a finite field multiplication between one of the M successive bits of the input data stream and one of M predetermined field elements, and each of the correction memory portions is untilized by said microprocessor to generate one syndrome;

a first conversion memory portion contains first conversion data items addressable by binary finite field elements stored therein so that each first conversion data item represents a power form of a binary finite field element which addresses the first conversion data item;

a second conversion memory portion contains second conversion data items addressable by power form field elements stored therein so that each second conversion data item represents a binary field element corresponding to the power form field element which addresses the second conversion data item; and a plurality of coefficient memory portions are each addressable by a coefficient of the inverse error location polynomonial and are each programmed to contain coefficient data items which equal $D \times \&^i$, where D represents the set of all possible coefficient values and i represents the power of the product for which a respective coefficient memory portion applies.

* * * * *